(12) United States Patent
Aleksov et al.

(10) Patent No.: US 9,788,581 B2
(45) Date of Patent: Oct. 17, 2017

(54) TEXTILE THAT INCLUDES AN ELECTRONIC SYSTEM

(71) Applicant: Intel Corporation, Santa Clara, CA (US)

(72) Inventors: Aleksandar Aleksov, Chandler, AZ (US); Adel Elsherbini, Chandler, AZ (US); Sasha Oster, Chandler, AZ (US); Braxton Lathrop, Lake Oswego, OR (US); Nadine L. Dabby, Palo Alto, CA (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 14/865,440

(22) Filed: Sep. 25, 2015

(65) Prior Publication Data

US 2017/0086510 A1    Mar. 30, 2017

(51) Int. Cl.
| | |
|---|---|
| *G06F 3/01* | (2006.01) |
| *H05K 7/00* | (2006.01) |
| *A41D 1/00* | (2006.01) |
| *G06F 1/16* | (2006.01) |
| *H05K 1/03* | (2006.01) |
| *H05K 1/02* | (2006.01) |

(52) U.S. Cl.
CPC ............ *A41D 1/002* (2013.01); *G06F 1/163* (2013.01); *H05K 1/0296* (2013.01); *H05K 1/038* (2013.01); *H05K 2201/10098* (2013.01); *H05K 2201/10151* (2013.01)

(58) Field of Classification Search
CPC .......................................................... G06F 3/01
USPC .................................................... 361/679.01
See application file for complete search history.

(56) References Cited

U.S. PATENT DOCUMENTS

2015/0075303 A1\* 3/2015 Connor ................ A61B 5/1126
73/865.4

\* cited by examiner

*Primary Examiner* — Jerry Wu
(74) *Attorney, Agent, or Firm* — Schwegman Lundberg & Woesner, P.A.

(57) ABSTRACT

Some forms relate to an electronic system that includes a textile. The electronic system includes a stretchable body that includes an integrated circuit that is configured to compute and communicate with an external device, wherein the stretchable body further includes at least one of (i) a power source that provides power to at least one of the electronic components; (ii) at least one sensor; (iii) a sensing node that receives signals from each sensor and sends signals to the integrated circuit; and (iv) an antenna that is configured to send and receive signals to and from the integrated circuit and the external device; and a textile attached to the stretchable body.

10 Claims, 7 Drawing Sheets

TEXTILE THAT INCLUDES AN ELECTRONIC SYSTEM

TECHNICAL FIELD

Embodiments described herein generally relate to a computing device, and more particularly to an electronic system that includes a textile.

BACKGROUND

Conventional wearable computing applications typically use stand-alone rigid devices (e.g., smart watches or glasses), or rigid bulky packs that snap into a connector on a garment or belt. One class of wearable computing devices that is rising in importance relates to textiles which include integrated electronic devices. More recent applications try to create "smart" garments that seamlessly integrate electronics into a garment that is able to be washed multiple times (e.g., by a washing machine).

Therefore, a need exists for a textile that may integrate various sensors, antennas, power supplies and electronic packages directly into the textile. Textiles that include such electronic systems may enable various approaches to managing different types of applications (e.g., wearable applications) where computing power may be utilized to enhance the application.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
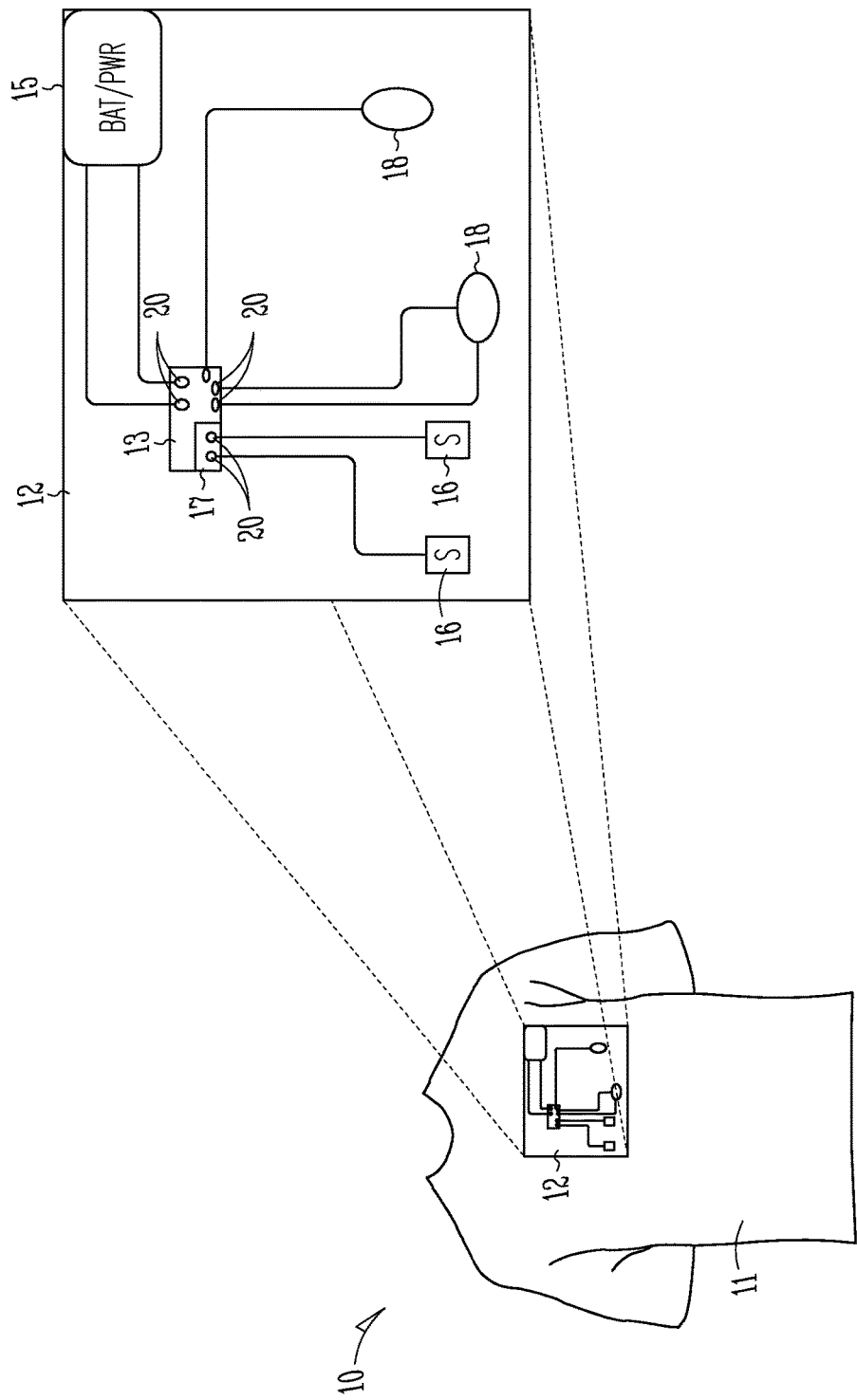
FIG. 1 is a schematic front view illustrating an electronic system that includes a textile.
Figure 2:
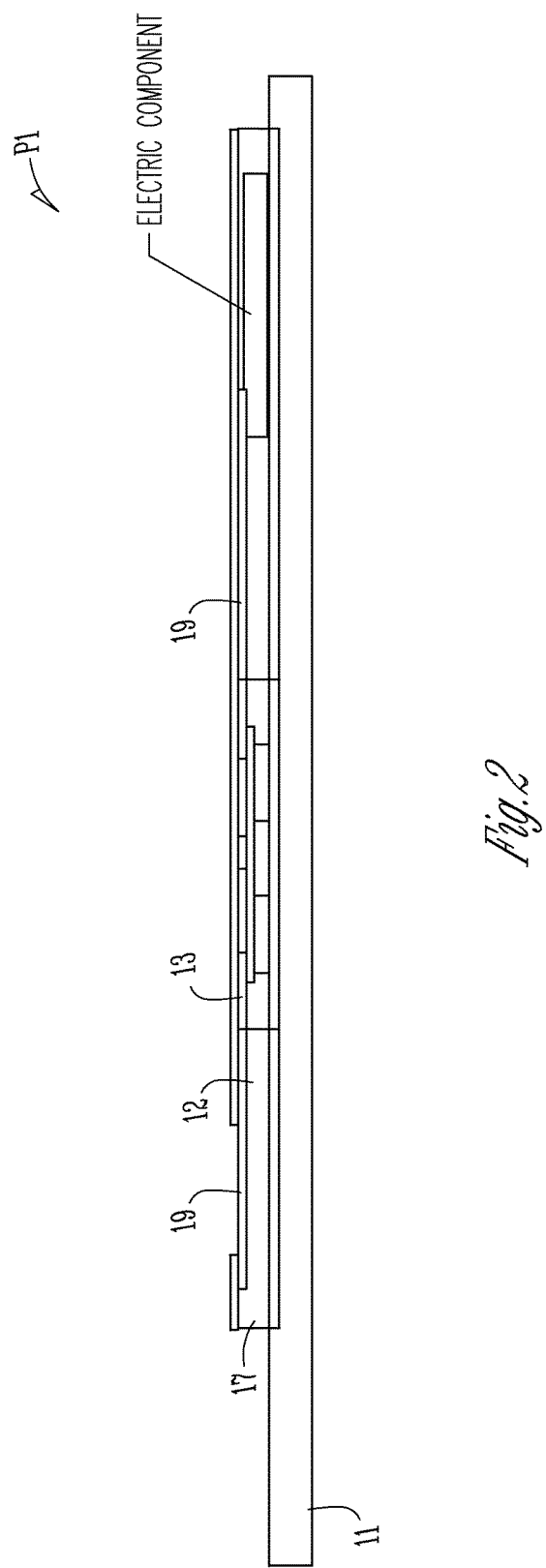
FIG. 2 is a side view of a portion of the example electronic system that includes the textile shown in FIG. 1.

FIG. 1 illustrates an example electronic system 10 that includes a textile 11. FIG. 2 is a side view of a portion P1 of the example electronic system 10 shown in FIG. 1.

The electronic system 10 includes a stretchable body 12 that includes an integrated circuit 13 that is configured to compute and communicate with an external device (not shown). The stretchable body 12 further includes at least one of (i) a power source 15 that provides power to at least one other electronic components; (ii) at least one sensor 16; (iii) a sensing node 17 that receives signals from each sensor 16 and sends signals to the integrated circuit 13; and (iv) an antenna 18 that is configured to send and receive signals to and from the integrated circuit 13 and the external device (multiple antennas are shown in FIG. 1).

The electronic system 10 further includes the textile 11 attached (e.g., adhered) to the stretchable body 10. In some forms, the textile 11 is fabric that forms a garment. It should be noted that any type of textile that is known now, or discovered in the future, may be used in the electronic system 10. The type of textile 11 that is used in the electronic system 10 will depend in part on the application where the electronic system 10 needs to be utilized.

The electronic system 10 further includes a plurality of a meandering conductors 19 (see FIG. 2) that connect the electronic components. In some forms, the plurality of meandering conductors 19 may be exposed from the stretchable body 12.

The electronic system 10 may further include a plurality of conductive pads 20 (see FIG. 2) that are electrically connected to at least one of the electronic components or some of the plurality of meandering conductors 19.

Figure 3:
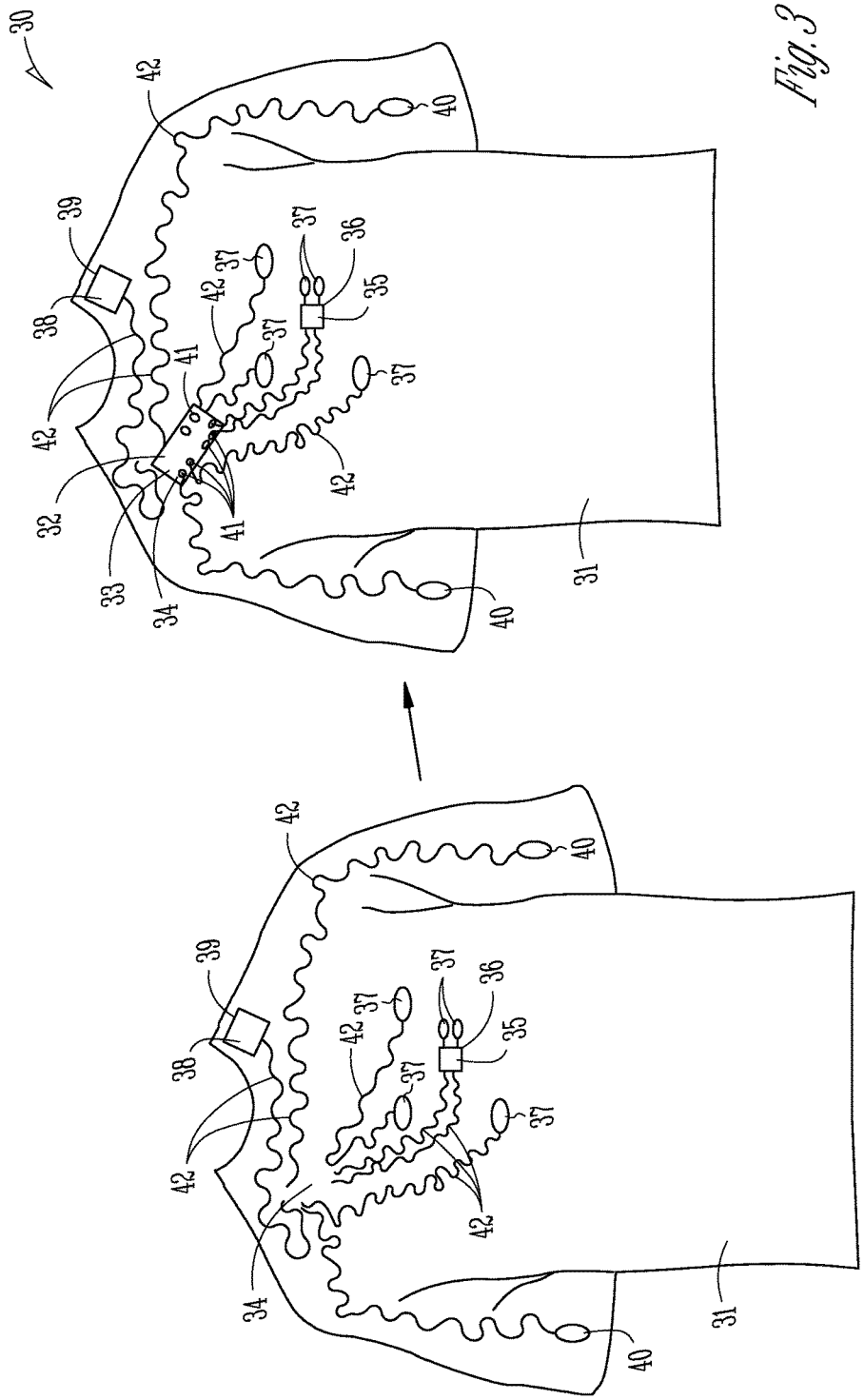
FIG. 3 is a schematic front view illustrating another example electronic system that includes a textile.
Figure 4:
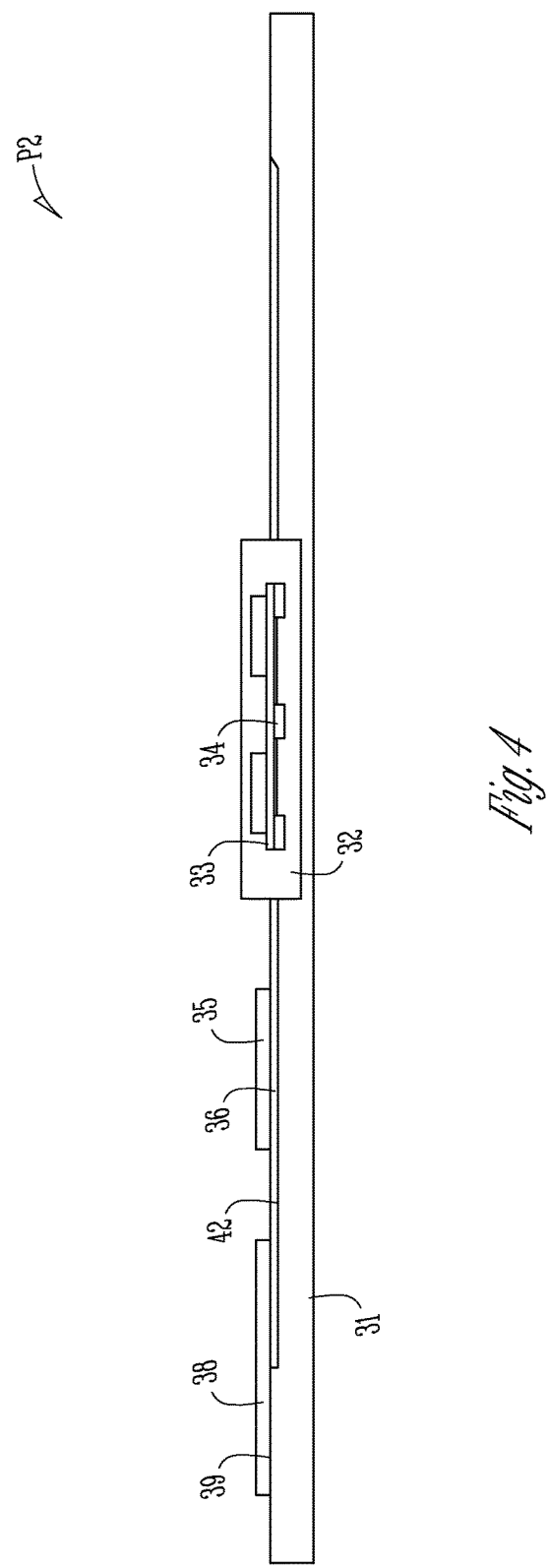
FIG. 4 is a side view of a portion of the example electronic system that includes the textile shown in FIG. 3.

FIG. 3 is a schematic front view illustrating another example electronic system 30 that includes a textile 31. FIG. 4 is side view of a portion P2 of the example electronic system 30 shown in FIG. 3.

The electronic system 30 includes a stretchable body 32 that includes an integrated circuit 33. The integrated circuit 33 is configured to compute and communicate with an external device (not shown). The stretchable body 32 is attached (e.g., adhered) to a first area 34 of the textile 31 (see FIG. 4).

The electronic system 10 further includes a sensing node 35 that is attached to a second area 36 of the textile 31. At least one sensor 37 sends signals to the sensing node 35. In addition, the sensing node 35 sends signals to the integrated circuit 33. It should be noted that each sensor 37 may be attached to a different area of the textile 31. In other forms (not FIG. 3), some sensors 37 are attached to the stretchable body 32 while other sensors 37 may be attached to an area that is separate from the stretchable body 32.

The electronic system further includes a power source 38 that is attached to a third area 39 of the textile 31. The power source 38 provides power to at least the integrated circuit 33, and potentially to one or more of the other electronic components that form the electronic system 30.

The electronic system 30 further includes one or more antennas 40 that are attached to different areas of the textile 31. The antenna(s) 40 are configured to send and receive signals to and from the integrated circuit 33 and the external device.

The electronic system 30 may further include a plurality of meandering conductors 42 (see FIG. 3) that connect one or more of the electronic components that are included in the electronic system 30. In some forms, the plurality of meandering conductors 42 are exposed from the stretchable body 32 and/or the textile 31.

The electronic system 30 may further include a plurality of conductive pads 41 (see FIG. 3) that are electrically connected to at least one of the electronic components or some of the plurality of meandering conductors 42. In some forms, the plurality of meandering conductors are (i) exposed from the stretchable body 32; and/or attached to the textile 31. The types of meandering conductors 42 and conductive pads that are included in the electronic system 30 will depend in part on the types of electronic components that are included in the electronic system 30 as well as the type of stretchable body 32 that is used and the electronic system 30 (among other factors).

As discussed above, the textile 31 may be a fabric that forms a garment. The type of textile 31 that is included in the electronic system 30 will depend in part on the application where the electronic 30 is to be used.

The electronic assemblies 10, 30 described herein incorporate an integrated circuit 13, 33 into a textile 11, 31. As an example, the textile may be a stretchable fabric that may be worn by a user. It should be noted that the stretchable bodies 12, 32 may include rigid portions and flexible portions depending on how many, and what type of, electronic components are included in the respective electronic systems 10, 30. In addition, some of the electronic components may be attached to the textile at different times depending on the manufacturing process that is associated with fabricating the electronic systems 10, 30.

A comparison of the electronic system 10 shown in FIGS. 1 and 2 with the electronic system 30 shown in FIGS. 3 and 4 illustrates different approaches for incorporating electronic components into the respective electronic systems 10, 30. FIGS. 1 and 2 show all of the electronic components on the stretchable body 12. In contrast, FIGS. 3 and 4 show only the integrated circuit 33 mounted on the stretchable body 32 while other of the electronic components are mounted on different areas of the textile and then connected remotely to the stretchable body 32 via a wired (or wireless—not shown) electrical connection. It should be noted that electronic systems are contemplated that are a mixture of electronic system 10 and electronic system 30 (i.e., some of the electronic components are on the respective stretchable bodies and others of the electronic components are mounted remotely from the stretchable bodies).

The electronic systems 10, 30 described herein may create a potentially soft, stretchable and flexible electronic system that is unobtrusive to a wearer of the textile. As an example, the wearer of the textile may not even realize that electronics are present while wearing or interacting with the electronics on the textile.

The materials that are selected for the respective stretchable bodies 12, 32 will depend in part on the application where the respective electronic systems 10, 30 are to be used as well as the manufacturing processes that are required in order to fabricate the electronic systems 10, 30. Some example materials for the stretchable bodies 12, 32 include, but are not limited to, Poly-Di-Methyl-Siloxane (PDMS) and other silicon-based elastomers, Thermo-Plastic-Polyurethane elastomers (TPUs), butyl rubber and other elastomer and elastomer-like materials (among other materials).

In addition, the sensors 16, 37 that are incorporated into the electronic systems 10, 30 may be any sensor that is known now, or discovered in the future. Some example types of sensors that may be included in the electronic systems 10, 30 include, but are not limited to blood pressure monitors, on-skin blood-sugar monitors, chemical sensors (for sweat and metabolism analysis), heart rate sensors, heart waveform monitors (i.e., ECG), electro myogram sensors (for muscle activation analysis), motion sensors, strain sensors, shock sensors and/or transpiration rate sensors (among many other types of sensors). In some forms, the sensors 16, 37 may be connected to a respective integrated circuit 13, 33 on the stretchable bodies 22, 32 in wireless fashion or using a wired connection (e.g., by using a meandering conductor).

In some forms, the electronic systems 10, 30 may include a power source 18, 38 (e.g., batteries—among other types of power sources). The power source in the electronic systems 10, 30 may provide power to one, some or all of the electronic components in the electronic systems 10, 30. The battery (or batteries) may be located on the stretchable bodies 12, 32 (see FIG. 2) or located remotely from the stretchable bodies 12, 32 (see FIG. 4). In some forms, the batteries located outside of the electronic system 10, 30. As an example, the battery may be incorporated into a shirt button that is part of a textile.

The types of antennas 18, 40 that are included in the electronic systems 10, 30 will depend in part on the application where the electronic systems 10, 30 are to be utilized. As an example, different types of antennas may be included in the electronic systems 10, 30 depending on the range that the wireless signal must be sent and received to and from the integrated circuits 13, 33 and/or the external device. It should be noted that any antenna that is known now, or discovered in the future, may be included in the electronic systems 10, 30.

The antennas 18, 40 that are used in the electronic systems 10, 30 may be made of more than one antenna. As examples, some antennas may be used for charging and other types of antennas may be used for different wireless communication standards.

Figure 5:
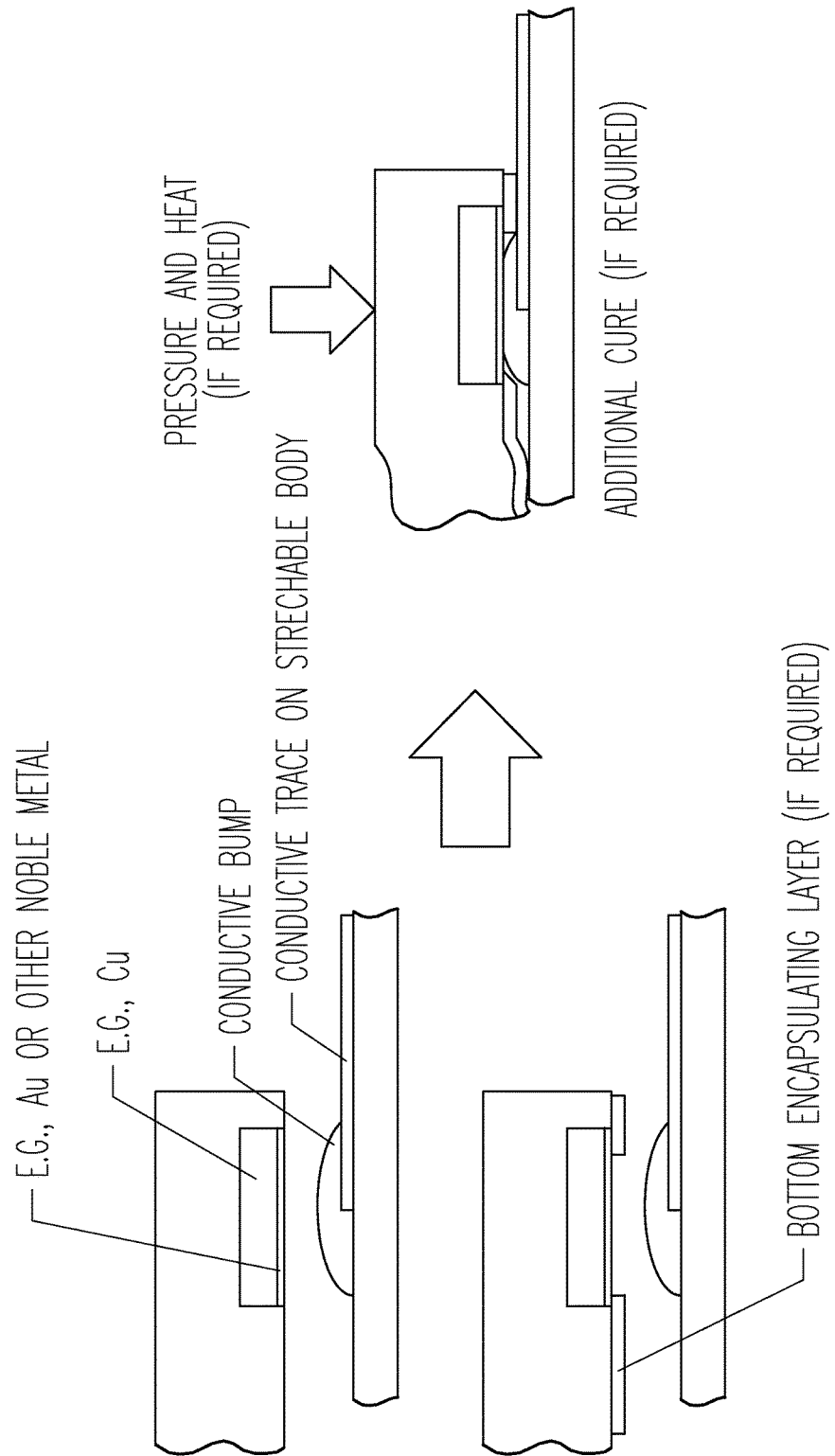
FIG. 5 is a schematic side view illustrating a portion of an example method of fabricating the electronic system that includes the textile shown in FIG. 1 or 3.
Figure 6:
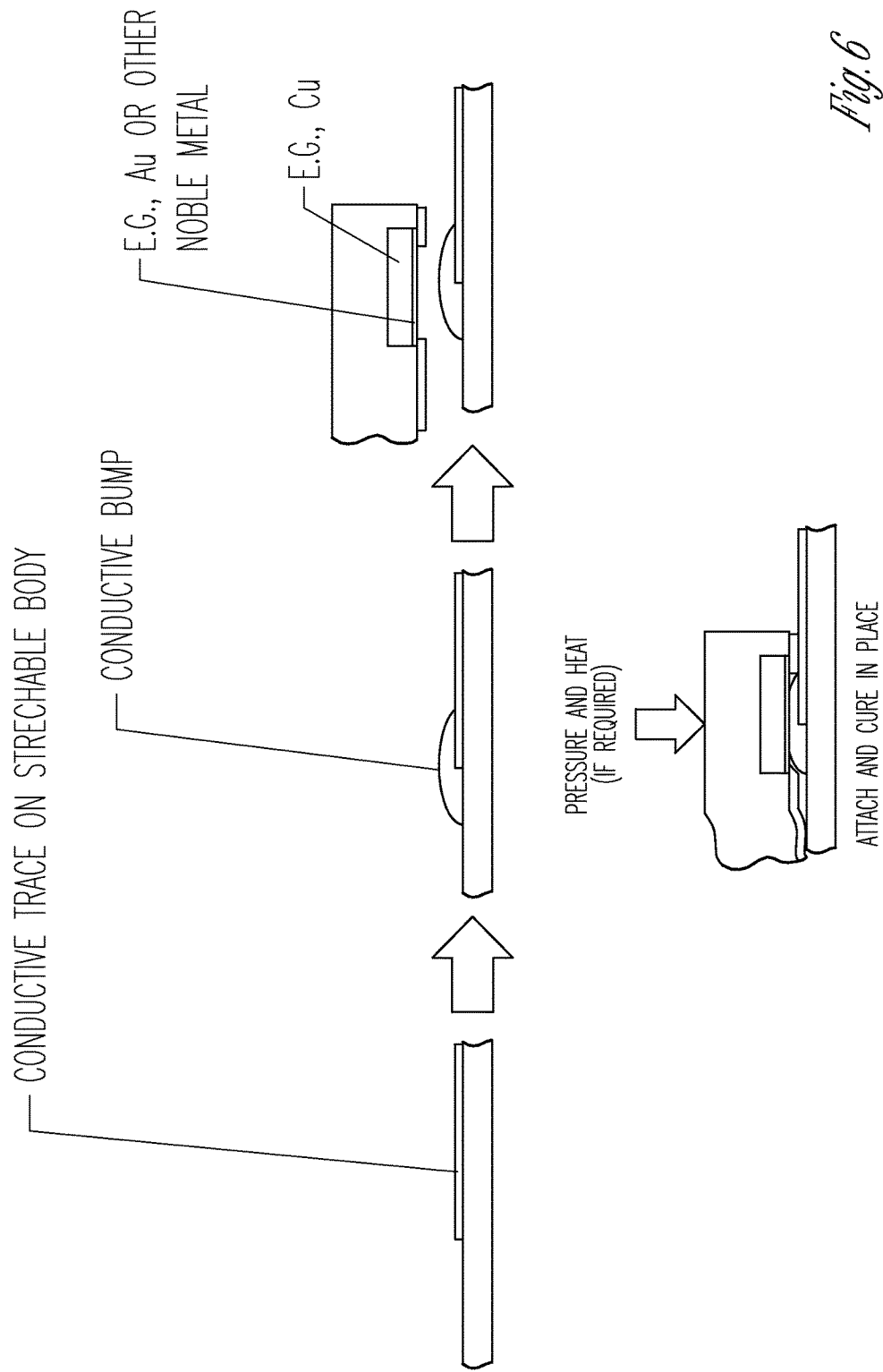
FIG. 6 is a schematic side view illustrating a portion of another example method of fabricating the electronic system that includes the textile shown in FIG. 1 or 3.

FIG. 5 is a schematic view illustrating a portion of an example method of fabricating the electronic systems 10, 30 shown in FIG. 1 or 3. FIG. 6 is a schematic view illustrating a portion of another example method of fabricating the electronic systems 10, 30 shown in FIG. 1 or 3.

The portions of the example methods shown in FIGS. 5 and 6 are not the only methods for fabricating the electronic systems 10, 30. The types of manufacturing process that are used to fabricate the electronic systems 10, 30 will depend in part on the (i) application where the electronic systems 10, 30 are to be used; (ii) types of materials that are included and the electronic systems 10, 30; (iii) types of electronic components that are included in the electronic systems 10, 30; and (iv) types of textiles that are included in the electronic systems 10, 30 (among other factors).

It should be noted that any of the electronic components that are included in electronic systems 10, 30 described herein may include programmable hardware that may be programmed before or after attachment to the textile. In addition, when the electronic systems include an antenna, the hardware may have over-the-air programming capability.

The meandering conductors 19, 42 that are included in electronic systems 10, 30 described herein may be manufactured by a variety of techniques that are known now, or discovered in the future. As examples, the meandering conductors may be adhered to the stretchable body by electroless processes, electroplating processes or screen printing (among other types of processes).

In some forms, the external device may be a user interface and/or a display. The user interface and/or the display may be incorporated into the electronic components on the textile, or may be located remotely from the textile, depending on the application where the electronic systems 10, 30 are to be used.

Figure 7:
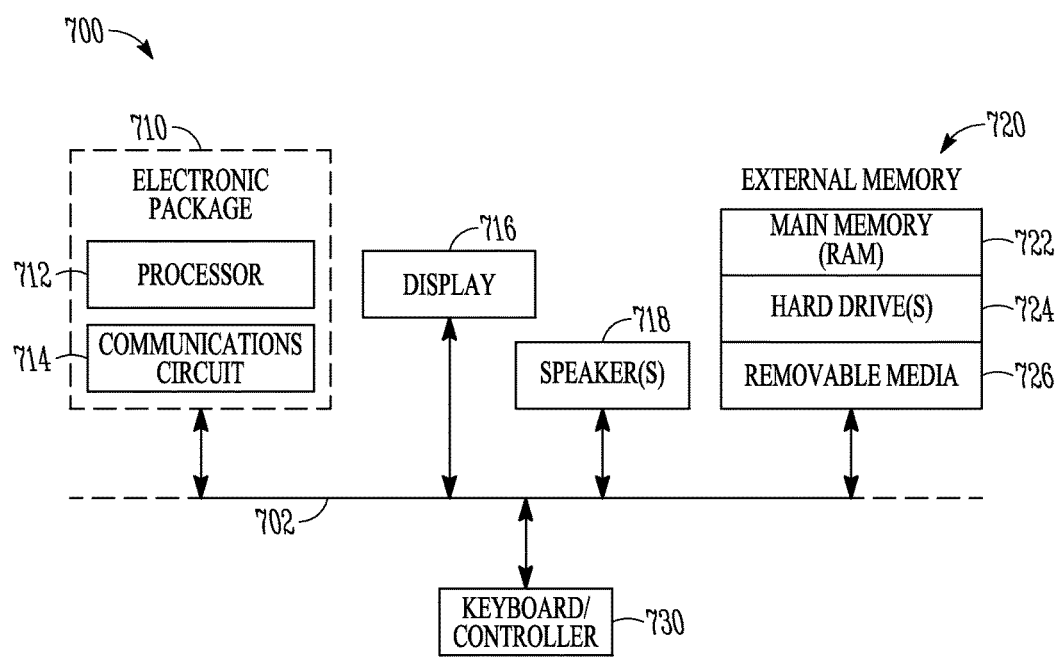
FIG. 7 is block diagram of an electronic apparatus that includes the electronic systems described herein.

FIG. 7 is a block diagram of an electronic apparatus 700 incorporating at least one of the electronic systems 10, 30 described herein. Electronic apparatus 700 is merely one example of an electronic apparatus in which the electronic systems 10, 30 described herein described herein may be used. Examples of an electronic apparatus 700 include, but are not limited to, personal computers, tablet computers, mobile telephones, game devices, MP3 or other digital media players, etc. In this example, electronic apparatus 700 comprises a data processing system that includes a system bus 702 to couple the various components of the electronic apparatus 700. System bus 702 provides communications links among the various components of the electronic apparatus 700 and may be implemented as a single bus, as a combination of busses, or in any other suitable manner.

An electronic apparatus 700 as describe herein may be coupled to system bus 702. The electronic apparatus 700 may include any circuit or combination of circuits. In one embodiment, the electronic apparatus 700 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 700 are a custom circuit, an application-specific integrated circuit (ASIC), or the like, such as, for example, one or more circuits (such as a communications circuit 714) for use in wireless devices like mobile telephones, tablet computers, laptop computers, two-way radios, and similar electronic systems. The IC can perform any other type of function.

The electronic apparatus 700 may also include an external memory 720, which in turn may include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic apparatus 700 may also include a display device 716, one or more speakers 718, and a keyboard and/or controller 730, which can include a mouse, trackball, touch pad, voice-recognition device, or any other device that permits a system user to input information into and receive information from the electronic apparatus 700.

To better illustrate the electronic systems 10, 30 described herein, a non-limiting list of examples is provided herein:

Example 1 includes an electronic system that includes a textile. The electronic system includes a stretchable body that includes at least one electronic component, wherein the electronic component is an integrated circuit that is configured to compute and communicate with an external device; and a textile attached to the stretchable body.

Example 2 includes the electronic system of example 1, wherein the stretchable body includes a plurality of electronic components.

Example 3 includes the electronic system of any one of examples 1-2, wherein the flexible touch pad are configured to be incorporated into a textile.

Example 4 includes the electronic system of any one of examples 1-3, and further including a plurality of meandering conductors that connect the electronic component.

Example 5 includes the electronic system of any one of examples 1-4, and further including a plurality of conductive pads that are electrically connected to at least one of the electronic components or some of the plurality of meandering conductors, wherein the plurality of meandering conductors are exposed from the stretchable body.

Example 6 includes the electronic system of any one of examples 1-5, wherein at least one of the electronic components is a power source.

Example 7 includes the electronic system of any one of examples 1-6, wherein at least one of the electronic components is a sensing node and another of the electronic components is a sensor that sends signals to the sensing node, wherein the sensing node sends signals to the integrated circuit.

Example 8 includes the electronic system of any one of examples 1-7, wherein the integrated circuit sends wireless signals to an external device.

Example 9 includes the electronic system of any one of examples 1-8, wherein the integrated circuit includes a computation node and a communication node.

Example 10 includes the electronic system of any one of examples 1-9, wherein the computation node and the communication node are separate electronic packages within the stretchable body.

Example 11 includes the electronic system of any one of examples 1-10, wherein the stretchable body is adhered to the textile.

Example 12 includes the electronic system of any one of examples 1-11, and further including a power source attached to the textile, wherein the power source provides power to the integrated circuit.

Example 13 includes the electronic system of any one of examples 1-12, and further including an antenna attached to the textile, wherein the antenna is configured to send and receive signals to and from the integrated circuit and an external device.

Example 14 includes the electronic system of any one of examples 1-13, and further including a sensing node attached to the textile and a sensor attached to the textile, wherein the sensor sends signals to the sensing node and the sensing node sends signals to the integrated circuit.

Example 15 includes an electronic system that includes a textile. The electronic system includes a stretchable body that includes an integrated circuit that is configured to compute and communicate with an external device, wherein the stretchable body further includes at least one of (i) a power source that provides power to at least one of the electronic components; (ii) at least one sensor; (iii) a sensing node that receives signals from each sensor and sends signals to the integrated circuit; and (iv) an antenna that is configured to send and receive signals to and from the integrated circuit and the external device; and a textile attached to the stretchable body.

Example 16 includes the electronic system of example 15, and further including a plurality of meandering conductors that connect the electronic components, wherein the plurality of meandering conductors are exposed from the stretchable body; and a plurality of conductive pads that are electrically connected to at least one of the electronic components or some of the plurality of meandering conductors, wherein the plurality of meandering conductors are exposed from the stretchable body.

Example 17 includes the electronic system of any one of examples 15-16, wherein the textile is fabric that forms a garment.

Example 18 includes an electronic system that includes a textile. The electronic system includes a stretchable body that includes an integrated circuit that is configured to compute and communicate with an external device; a textile, wherein the stretchable body is attached to a first area of the textile; a sensing node attached to a second area of the textile; at least one sensor that sends signals to the sensing node, wherein the sensing node sends signals to the integrated circuit, wherein each sensor is attached a different area of the textile than the integrated circuit; a power source attached to a third area of the textile, wherein the power source provides power to at least the integrated circuit; and an antenna attached to a fourth area of the textile, wherein the antenna is configured to send and receive signals to and from the integrated circuit and the external device.

Example 19 includes the electronic system of example 18, further comprising a plurality of meandering conductors that connect the electronic components, wherein the plurality of meandering conductors are exposed from the stretchable body; and a plurality of conductive pads that are electrically connected to at least one of the electronic components or some of the plurality of meandering conductors, wherein the plurality of meandering conductors are exposed from the stretchable body.

Example 20 includes the electronic system of any one of examples 18-19, wherein the textile is fabric that forms a garment.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A wearable electronic system, comprising:
a stretchable body that includes at least one electronic component, wherein the electronic component is an integrated circuit that is configured to compute and communicate with an external device, wherein the stretchable body includes a plurality of electronic components that are mounted to the stretchable body, wherein at least one of the electronic components is a power source that is mounted to the stretchable body; and a textile to be worn by a user and attached to the stretchable body; and a sensing node received signals from a plurality of sensors, and an antenna is configured to send and receive signals to and from the integrated circuit and an external device; wherein the sensors and the antenna, are in locations that are separate from the stretchable body and connected by meandering conductors.

2. The electronic system of claim 1, further comprising a plurality of meandering conductors that connect the electronic component.

3. The electronic system of claim 2, wherein the plurality of meandering conductors are exposed from the stretchable body.

4. The electronic system of claim 2, further comprising a plurality of conductive pads that are electrically connected to at least one of the components or some of the plurality of meandering conductors, wherein the plurality of meandering conductors are exposed from the stretchable body.

5. The electronic system of claim 2, wherein at least one of the electronic components is a sensing node and another of the electronic components is a sensor that sends signals to the sensing node, wherein the sensing node sends signals to the integrated circuit.

6. The electronic system of claim 2, wherein the integrated circuit sends wireless signals to an external device.

7. The electronic system of claim 1, wherein the stretchable body is adhered to the textile.

8. A wearable electronic system, comprising: a stretchable body that includes an integrated circuit that is mounted to the stretchable body and is configured to compute and communicate with an external device; a textile to be worn by a user, wherein the stretchable body is attached to a first area of the textile; a sensing node attached to a second area of the textile; at least one sensor that sends signals to the sensing node by meandering conductors, wherein the sensing node sends signals to the integrated circuit by meandering conductors, wherein each sensor is attached a different area of the textile than the integrated circuit; a power source attached to a third area of the textile, wherein the power source provides power to at least the integrated circuit; and an antenna attached to a fourth area of the textile, wherein the antenna is configured to send and receive signals to and from the integrated circuit and the external device by meandering conductors, wherein the first, second, third and fourth areas of the textile are separate from one another.

9. The electronic system of claim 8, further comprising a plurality of meandering conductors that connect the electronic components, wherein the plurality of meandering conductors are exposed from the stretchable body; and a plurality of conductive pads that are electrically connected to at least one of the electronic components or some of the plurality of meandering conductors.

10. The electronic system of claim 8, wherein the textile is fabric that forms a garment.

* * * * *